(12) United States Patent
Tang et al.

(10) Patent No.: US 8,076,959 B2
(45) Date of Patent: Dec. 13, 2011

(54) CIRCUITS AND METHODS FOR VOLTAGE DETECTION

(75) Inventors: Xiaohu Tang, Shanghai (CN); Weidong Xue, Shanghai (CN); Yan Li, Wuhan (CN)

(73) Assignee: O2 Micro, Inc, Santa Clara, CA (US)

( * ) Notice: Subject to any disclaimer, the term of this patent is extended or adjusted under 35 U.S.C. 154(b) by 97 days.

(21) Appl. No.: 12/607,279

(22) Filed: Oct. 28, 2009

(65) Prior Publication Data

US 2011/0095789 A1    Apr. 28, 2011

(51) Int. Cl.
*H03K 5/153* (2006.01)
(52) U.S. Cl. ......................................................... 327/77
(58) Field of Classification Search .................... 327/77, 327/78, 142, 143, 198
See application file for complete search history.

(56) References Cited

U.S. PATENT DOCUMENTS

| | | | | | |
|---|---|---|---|---|---|
| 5,528,182 | A | * | 6/1996 | Yokosawa | 327/143 |
| 6,020,768 | A | * | 2/2000 | Lim | 327/77 |
| 6,137,324 | A | * | 10/2000 | Chung | 327/143 |
| 6,842,321 | B2 | | 1/2005 | Brohlin | |
| 6,867,624 | B2 | * | 3/2005 | Wang | 327/81 |

* cited by examiner

*Primary Examiner* — Quan Tra

(57) ABSTRACT

A circuit for detecting an input voltage includes a voltage-to-current converter and a current comparator. The voltage-to-current converter is operable for generating a monitoring current that varies in accordance with the input voltage. The current comparator coupled to the voltage-to-current converter is operable for comparing the monitoring current to a threshold current proportional to the temperature of the circuit, and for generating a detection signal indicating a condition of the input voltage based on a result of the comparison.

18 Claims, 13 Drawing Sheets

CIRCUITS AND METHODS FOR VOLTAGE DETECTION

BACKGROUND

Electronic devices may not operate properly if a voltage level of a power supply drops below a predetermined threshold. FIG. 1 shows a schematic diagram of a conventional under-voltage detection circuit 100. The under-voltage detection circuit 100 can include a bandgap circuit 102, a voltage comparator 104, and a voltage divider 106. The bandgap circuit 102 can generate a reference bandgap voltage which remains substantially constant if temperature varies. The voltage divider 106 receives an input voltage VIN, and provides a sense voltage proportional to the input voltage VIN at a node 108. The voltage comparator 104 compares the sense voltage to the reference bandgap voltage, and generates a detection signal UVA indicating an under-voltage condition if the sense voltage is less than the reference bandgap voltage. However, since a level of a current flowing through the voltage divider 106 is proportional to a level of the input voltage VIN, power consumption of the under-voltage detection circuit 100 may be increased when the input voltage VIN is increased.

FIG. 2 shows a schematic diagram of another conventional under-voltage detection circuit 200. The under-voltage detection circuit 200 includes a current generator 208 and a voltage comparator 204. The current generator 208 generates a current proportional to temperature (e.g., absolute temperature) of the under-voltage detection circuit 200. A first bandgap voltage generator constituted by a bipolar transistor Q2 and a resistor R3 can receive the current and can provide a first bandgap voltage accordingly. Similarly, a second bandgap voltage generator constituted by a bipolar transistor Q6 and a resistor R2 can provide a second bandgap voltage. Therefore, a sense voltage, e.g., equal to the input voltage VIN minus the first bandgap voltage, is obtained at a node 202. A threshold voltage, e.g., equal to the second bandgap voltage, is obtained at a node 201. The voltage comparator 204 generates a detection signal UVA indicating an under-voltage condition if the sense voltage is less than the threshold voltage.

However, the voltage comparator, e.g., the voltage comparator 104 or 204, may increase the complexity and cost of the under-voltage detection circuit 100 or 200. Moreover, oscillations of the under-voltage detection circuit 100 or 200 may be triggered. For example, if the sense voltage is increased to be greater than the threshold voltage and then decreased to be less than the threshold voltage in a relatively short time period, e.g., caused by noise of the under-voltage detection circuit, the detection signal UVA may oscillate between two states, e.g., a high electrical level and a low electrical level. Thus, stability of the under-voltage detection circuit 100 or 200 may be decreased.

SUMMARY

In one embodiment, a circuit for detecting an input voltage includes a voltage-to-current converter and a current comparator. The voltage-to-current converter is operable for generating a monitoring current that varies in accordance with the input voltage. The current comparator coupled to the voltage-to-current converter is operable for comparing a monitoring current to the threshold current proportional to the temperature of the circuit, and for generating a detection signal indicating a condition of the input voltage based on a result of the comparison.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments in accordance with the present disclosure provide a circuit for detecting a condition of an input voltage. The voltage detection circuit includes a voltage-to-current converter and a current comparator. The voltage-to-current converter generates a monitoring current that varies in accordance with the input voltage. The current comparator compares the monitoring current to a threshold current, and generates a detection signal VA indicating the condition of the input voltage according to a result of the comparison. The detection signal VA can indicate whether the input voltage is greater or less than a predetermined threshold. Advantageously, compared to the voltage comparator in the conventional under-voltage detection circuit, the voltage-to-current converter and the current comparator may employ less current branches. Thus, the chip size and power consumption of the voltage detection circuit can be reduced.

Figure 3A:
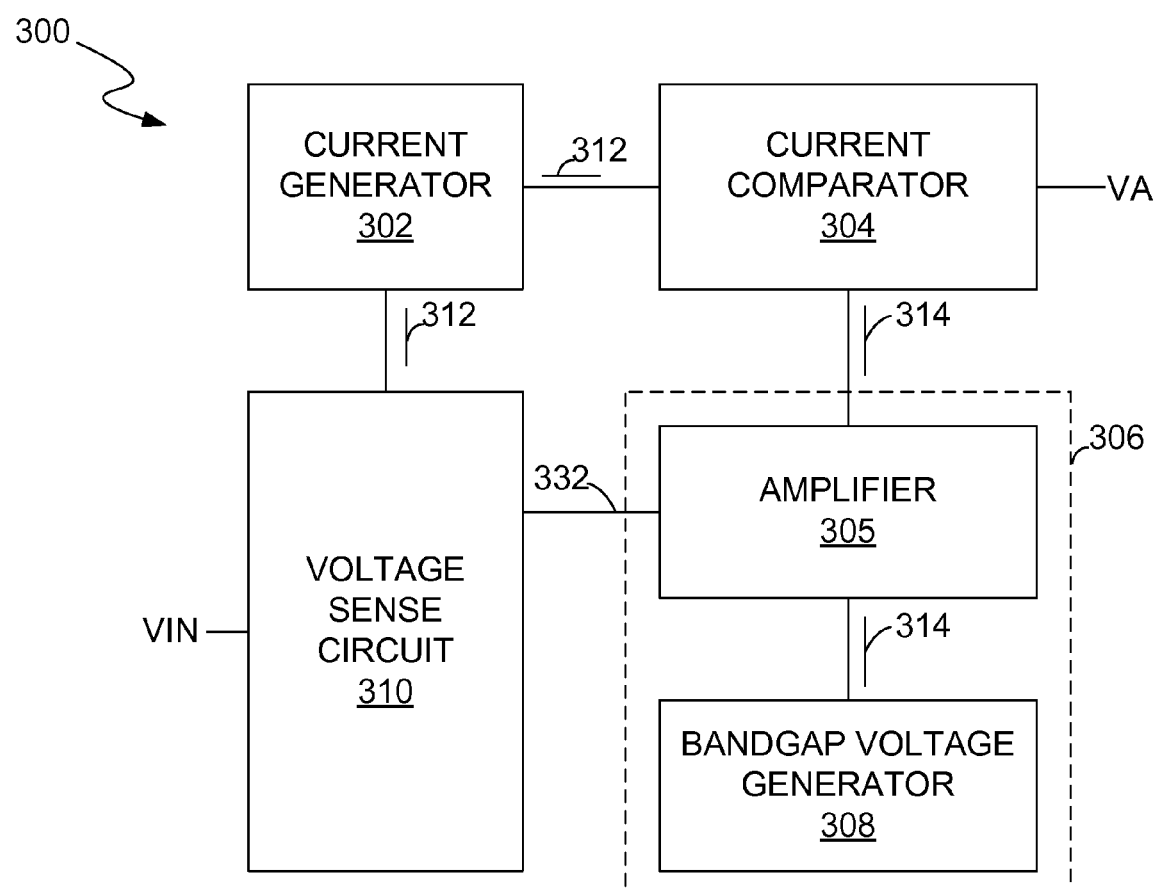
FIG. 3A illustrates a block diagram of a voltage detection circuit, in accordance with one embodiment of the present invention.

FIG. 3A illustrates a block diagram of a voltage detection circuit 300, in accordance with one embodiment of the present invention. The voltage detection circuit 300 includes a current generator 302, a current comparator 304, a voltage-to-current converter 306, and a voltage sense circuit 310. The voltage sense circuit 310 is operable for receiving an input voltage VIN, and for generating a sense signal 332 indicative of the input voltage VIN. The voltage-to-current converter 306 coupled to the voltage sense circuit 310 is operable for receiving the sense signal 332, and for generating a monitoring current 314 that varies according to the sense signal 332. The current generator 302 is operable for generating a threshold current 312. The current comparator 304 coupled to the current generator 302 and to the voltage-to-current converter 306 is operable for comparing the monitoring current 314 to the threshold current 312, and for generating a detection signal VA according to a result of the comparison. The detection signal VA indicates a condition of the input voltage VIN, e.g., whether the input voltage VIN is greater or less than a predetermined threshold. Thus, in one embodiment, the voltage detection circuit 300 can be used to detect an over-voltage condition. In another embodiment, the voltage detection circuit 300 can be used to detect an under-voltage condition.

In one embodiment, the threshold current 312 generated by the current generator 302 is approximately proportional to the temperature (e.g., the absolute temperature) of the voltage detection circuit 300, and can be used by a bandgap voltage generator to generate a bandgap voltage which remains substantially constant if the temperature varies. For example, as the threshold current 312 is approximately proportional to the temperature, a voltage across a resistor can have a positive temperature coefficient if the threshold current 312 flows through the resistor. Thus, if an electronic component having a negative temperature coefficient (e.g., a metal-oxide semiconductor field effect (MOS) transistor or a bipolar junction transistor) is in series with the resistor, a total voltage across the resistor and the electronic component can be independent of the temperature and thus is a bandgap voltage. The bandgap voltage can be used by a reference circuit to set a reference voltage, e.g., a voltage threshold, so as to improve the accuracy of the reference voltage.

In one embodiment, the voltage sense circuit 310 receives the threshold current 312. In the example of FIG. 3A, the voltage sense circuit 310 is coupled to the current generator 302 and shares a current branch of the threshold current 312 with the current generator 302. Alternatively, the voltage sense circuit 310 and the current generator 302 may employ different current branches, e.g., the voltage sense circuit 310 can receive the threshold current 312 by mirroring the threshold current 312. Thus, the threshold current 312 can flow through the current generator 302 and the voltage sense circuit 310 simultaneously.

The voltage sense circuit 310 can receive the input voltage VIN and can generate the sense signal 332 indicative of the input voltage VIN. In one embodiment, a voltage V_SENSE of the sense signal 332 can be approximately equal to the input voltage VIN, e.g., V_SENSE=VIN. In another embodiment, the voltage sense circuit 310 can employ a current (e.g., the threshold current 312) that is proportional to the temperature to provide a bandgap voltage VB1, and can generate the sense signal 332 based on the bandgap voltage VB1 and the input voltage VIN. For example, V_SENSE can be equal to the input voltage VIN plus or minus the bandgap voltage VB1, e.g., V_SENSE=VIN±VB1.

The voltage-to-current converter 306 receives the sense signal 332 indicative of the input voltage VIN, and generates the monitoring current 314 based on the sense signal 332. In one embodiment, the voltage-to-current converter 306 can include, but is not limited to, a voltage-controlled current source for generating the monitoring current 314 based on the sense signal 332. As a result, the monitoring current 314 varies in accordance with the input voltage VIN. For example, the monitoring current 314 can be increased if the input voltage VIN is increased. However, this invention is not so limited; in another embodiment, the monitoring current 314 can be increased if the input voltage VIN is decreased.

The current comparator 304 is operable for receiving the threshold current 312 and the monitoring current 314. In one embodiment, the monitoring current 314 flows into the current comparator 304. Thus, the voltage-to-current converter 306 shares a current branch with the current comparator 304. In addition, the current comparator 304 can receive the threshold current 312.

The current comparator 304 compares the monitoring current 314 to the threshold current 312, and generates a voltage detection signal VA according to a result of the comparison. The detection signal VA indicates a condition of the input voltage VIN. More specifically, in one embodiment, the voltage-to-current converter 306 can define a voltage threshold VTH1 associated with the sense signal 332. When the monitoring current 314 is equal to the threshold current 312, it indicates that the voltage V_SENSE of the sense signal 332 is equal to the voltage threshold VTH1. The voltage detection circuit 300 can also define a voltage threshold VTH2 associated with the input voltage VIN. By way of example, VTH2 is equal to VTH1 (when VIN=V_SENSE) or VTH1±VB1 (when VIN=V_SENSE±VB1). As a result, when the monitoring current 314 is equal to the threshold current 312, it indicates that the input voltage VIN is equal to the voltage threshold VTH2.

The voltage detection circuit 300 compares the input voltage VIN to the voltage threshold VTH2 by comparing the monitoring current 314 to the threshold current 312. For example, the comparison result that the monitoring current 314 is greater than the threshold current 312 indicates that the input voltage VIN is greater than the voltage threshold VTH2. Therefore, the detection signal VA can be generated to indicate a first voltage condition, e.g., VIN>VTH2. Similarly, the comparison result that the monitoring current 314 is less than the threshold current 312 indicates that the input voltage VIN is less than the voltage threshold VTH2. Thus, the detection signal VA can be generated to indicate a second voltage condition, e.g., VIN<VTH2.

Figure 1:
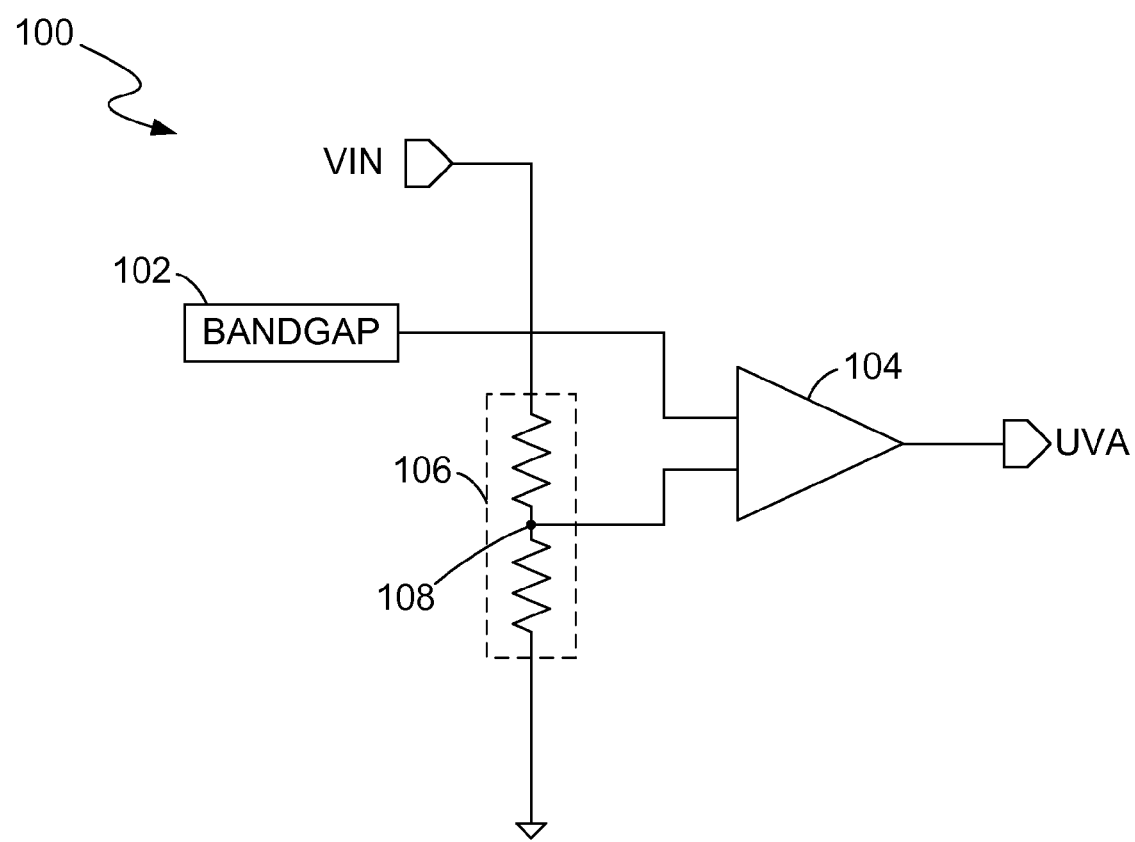
FIG. 1 shows a schematic diagram of a conventional under-voltage detection circuit.
Figure 2:
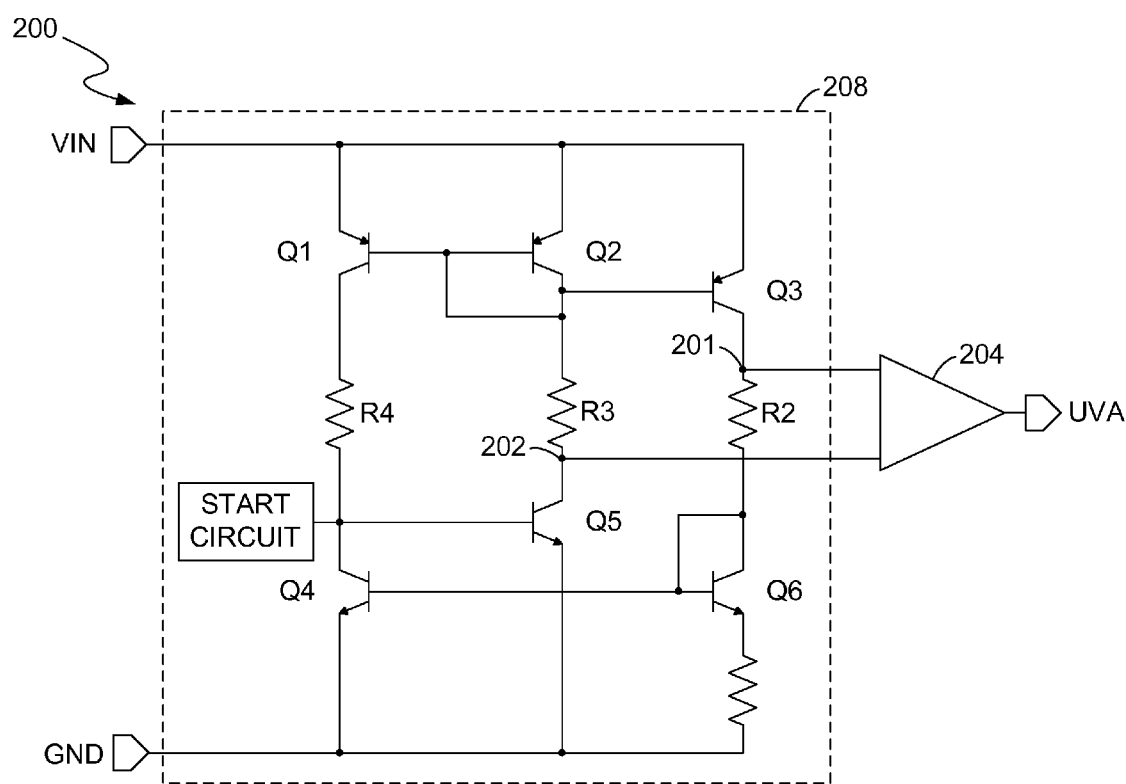
FIG. 2 shows a schematic diagram of another conventional under-voltage detection circuit.

Advantageously, compared to a voltage comparator (e.g., the voltage comparator 104 in FIG. 1 or the voltage comparator 204 in FIG. 2) in the conventional under-voltage detection circuit, the voltage-to-current converter 306 and the current comparator 304 may employ less current branches, e.g., the voltage-to-current converter 306 and the current comparator 304 share one current branch for the monitoring current 314. Therefore, the chip size and power consumption of the voltage detection circuit 300 can be reduced.

In one embodiment, the voltage-to-current converter 306 can operate as a bandgap voltage generator capable of providing a bandgap voltage and setting the voltage thresholds VTH1 and VTH2 according to the bandgap voltage. In the example of FIG. 3A, the voltage-to-current converter 306 includes an amplifier 305 operable for controlling the monitoring current 314 according to the sense signal 332, and for providing a bandgap voltage VB2. More specifically, the monitoring current 314 can be approximately proportional to the temperature if the monitoring current 314 is equal to the threshold current 312. Thus, the voltage-to-current converter 306 can provide the bandgap voltage VB2 if the monitoring current 314 is equal to the threshold current 312. In one embodiment, the voltage threshold VTH1 can be determined by the bandgap voltage VB2, e.g., VTH1 is equal to VB2.

In another embodiment, the voltage-to-current converter 306 further includes a bandgap voltage generator 308 coupled to the amplifier 305 and operable for generating a bandgap voltage VB3. As such, the voltage threshold VTH1 can be determined by the bandgap voltages VB2 and VB3. For example, VTH1 can be set to be greater than VB2, e.g., VTH1=VB2+VB3. Advantageously, the voltage threshold VTH2 can be set to a bandgap voltage, e.g., VTH2=VB2 or VTH2=VB2+VB3 if VTH2=VTH1, or VTH2=VB2±VB1 or VTH2=VB2+VB3±VB1 if VTH2=VTH1±VB1. As such, the accuracy of the voltage thresholds VTH1 and VTH2 can be improved. The detailed operation of the voltage threshold VTH2 and the monitoring current 314 will be described in relation to FIG. 3B.

Advantageously, the voltage-to-current converter 306 has a hysteretic function which allows the voltage threshold VTH2 to have different levels, e.g., a level V1 and a level V2, according to the condition of the input voltage VIN, in one embodiment. More specifically, the bandgap voltage provided by the voltage-to-current converter 306 varies according to the condition of the input voltage VIN. In one embodiment, the bandgap voltage generator 308 generates the bandgap voltage VB3 having a level selected from at least a level VB3_1 and a level VB3_2. For example, the bandgap voltage VB3 has the level VB3_1 if VA has a first state indicating that the input voltage VIN is greater than the voltage threshold VTH2, and has the level VB3_2 if VA has a second state indicating that the input voltage VIN is less than the voltage threshold VTH2. Meanwhile, the monitoring current 314 can be adjusted by the voltage-to-current converter 306 according to the voltage threshold VTH2. As explained in relation to FIG. 3C, oscillations of the voltage detection circuit 300 can be reduced or avoided, which can further improve the stability of the voltage detection circuit 300.

Alternatively, to provide the voltage threshold VTH2 having different levels in different voltage conditions, the threshold current 312 can be adjusted according to the condition of the input voltage VIN. For example, the current generator 302 provides a compensation current proportional to the temperature to compensate the threshold current 312 in one voltage condition, which will be detailed described in relation to FIG. 3D. As a result, the oscillations of the detection circuit 300 can be reduced or avoided, which can further improve the stability of the detection circuit 300.

Figure 3B:
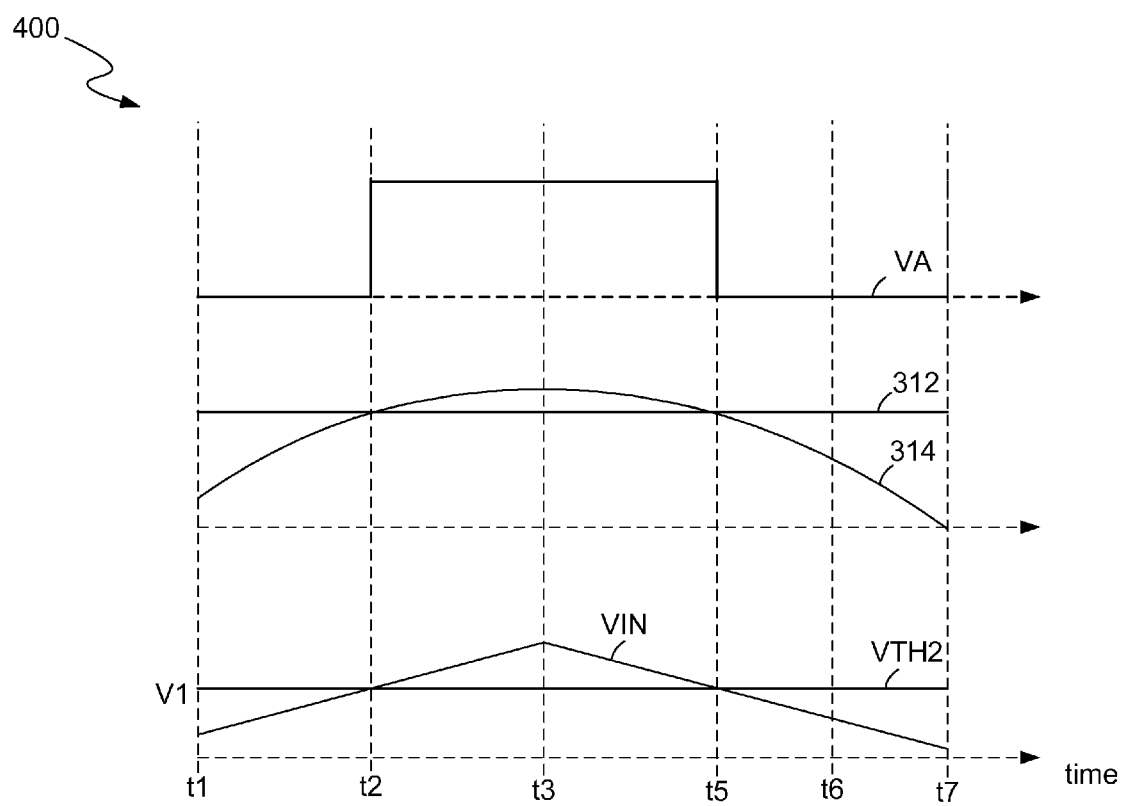
FIG. 3B illustrates a timing diagram of signals received and generated by a voltage detection circuit, in accordance with one embodiment of the present invention.

FIG. 3B illustrates a timing diagram 400 of signals received and generated by the voltage detection circuit 300 of FIG. 3A, in accordance with one embodiment of the present invention. FIG. 3B is described in combination with FIG. 3A. The timing diagram 400 shows the detection signal VA, the threshold current 312, the monitoring current 314, and the input voltage VIN.

In the example of FIG. 3B, the input voltage VIN is increased during a time interval of time t1 to t3, and is decreased during a time interval of time t3 to t7. The monitoring current 314 varies in accordance with the input voltage VIN. As such, the monitoring current 314 is increased during the time interval of t1 to t3, and is decreased during the time interval of t3 to t7.

In the example of FIG. 3B, the voltage threshold VTH2 does not vary according to the condition of the input voltage VIN. During the time intervals of t1 to t2 and t5 to t7, the monitoring current 314 is less than the threshold current 312. Thus, the current comparator 304 can generate the detection signal VA having a first state, e.g., a low electrical level, to indicate that the input voltage VIN is less than the voltage threshold VTH2. During the time interval of t2 to t5, the monitoring current 314 is greater than the threshold current 312. Thus, the current comparator 304 can generate the detection signal VA having a second state, e.g., a high electrical level, to indicate that the input voltage VIN is greater than the voltage threshold VTH2.

At time t2 or t5, the monitoring current 314 is equal to the threshold current 312, indicating that the input voltage VIN is equal to the voltage threshold VTH2. Advantageously, the voltage threshold VTH2 can be set to a bandgap voltage, e.g., VB2, such that the accuracy of the voltage threshold VTH2 is improved.

Figure 3C:
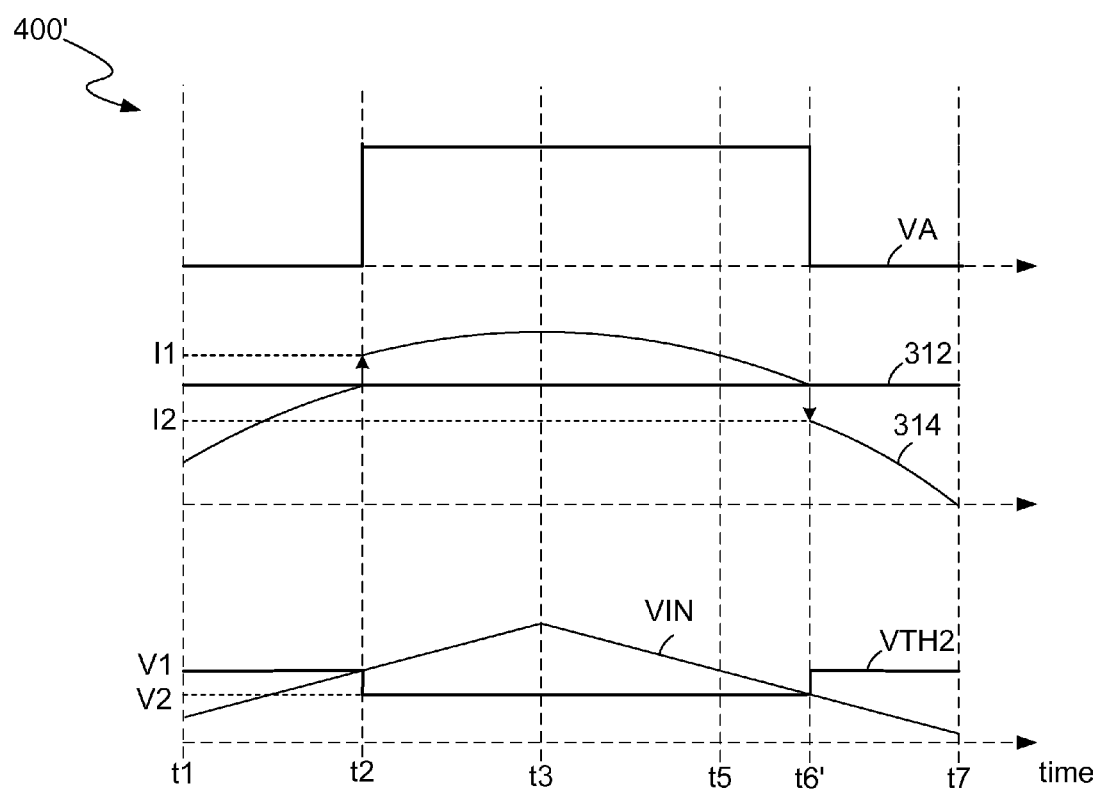
FIG. 3C illustrates another timing diagram of signals received and generated by a voltage detection circuit, in accordance with one embodiment of the present invention.

FIG. 3C illustrates another timing diagram 400' of signals received and generated by the voltage detection circuit 300 of FIG. 3A, in accordance with one embodiment of the present invention. FIG. 3C is described in combination with FIG. 3A. The timing diagram 400' shows the detection signal VA, the threshold current 312, the monitoring current 314, and the input voltage VIN.

In the example of FIG. 3C, the voltage threshold VTH2 varies according to the condition of the input voltage VIN. More specifically, the voltage threshold VTH2 is equal to the level V1, e.g., VB2+VB3_1, if the detection signal VA is in the first state, e.g., the low electrical level. The voltage threshold VTH2 is equal to the level V2, e.g., VB2+VB3_2, that is less than the level V1 if the detection signal VA is in the second state, e.g., the high electrical level.

During the time t1 to t2, the detection signal VA having the low electrical level indicates that the input voltage VIN is less than the voltage threshold VTH2 (VTH2=V1). At time t2, the input voltage VIN is equal to the level V1. Thus, the monitoring current 314 reaches the threshold current 312. As such, the state of the detection signal VA can be switched to the high electrical level from time t2. Once the state of the detection signal VA is changed to the high electrical level, the voltage threshold VTH2 is changed to the level V2. In one embodiment, the monitoring current 314 is adjusted according to the voltage threshold VTH2. As shown in the example of FIG. 3C, the monitoring current 314 is increased to a level I1 that is greater than the threshold current 312 at time t2. Advantageously, even if noise of the voltage detection circuit 300 may cause some slight variation of the input voltage VIN or the monitoring current 314, the monitoring current 314 will not drop to the threshold current 312, in one embodiment. Accordingly, the detection signal VA can remain at the high electrical level. In other words, the level I1 can be properly chosen such that the variation of the input voltage or the monitoring current caused by the noise of the voltage detection circuit 300 can be neglected and will not affect the detection signal VA. Therefore, the oscillations of the detection signal VA can be reduced or avoided.

At time t6', the input voltage VIN is decreased to the level V2. Thus, the monitoring current 314 is decreased to the threshold current 312. As such, the state of the detection signal VA can be switched to the low electrical level. Once the state of the detection signal VA is changed to the low electrical level, the voltage threshold VTH2 is changed to the level V1.

Similarly, the monitoring current 314 is decreased to a level I2 that is less than the threshold current 312. Advantageously, even if the noise of the voltage detection circuit 300 may cause some slight variation of the input voltage VIN or the monitoring current 314, the monitoring current 314 will not increase to the threshold current 312, in one embodiment. Accordingly, the detection signal VA can remain at the low electrical level. In other words, the level I2 can be properly chosen such that the variation of the input voltage or the monitoring current caused by the noise of the voltage detection circuit 300 can be neglected and will not affect the detection signal VA. Therefore, the oscillations of the detection signal VA can be reduced or avoided, which can improve the stability of the voltage detection circuit 300.

Figure 3D:
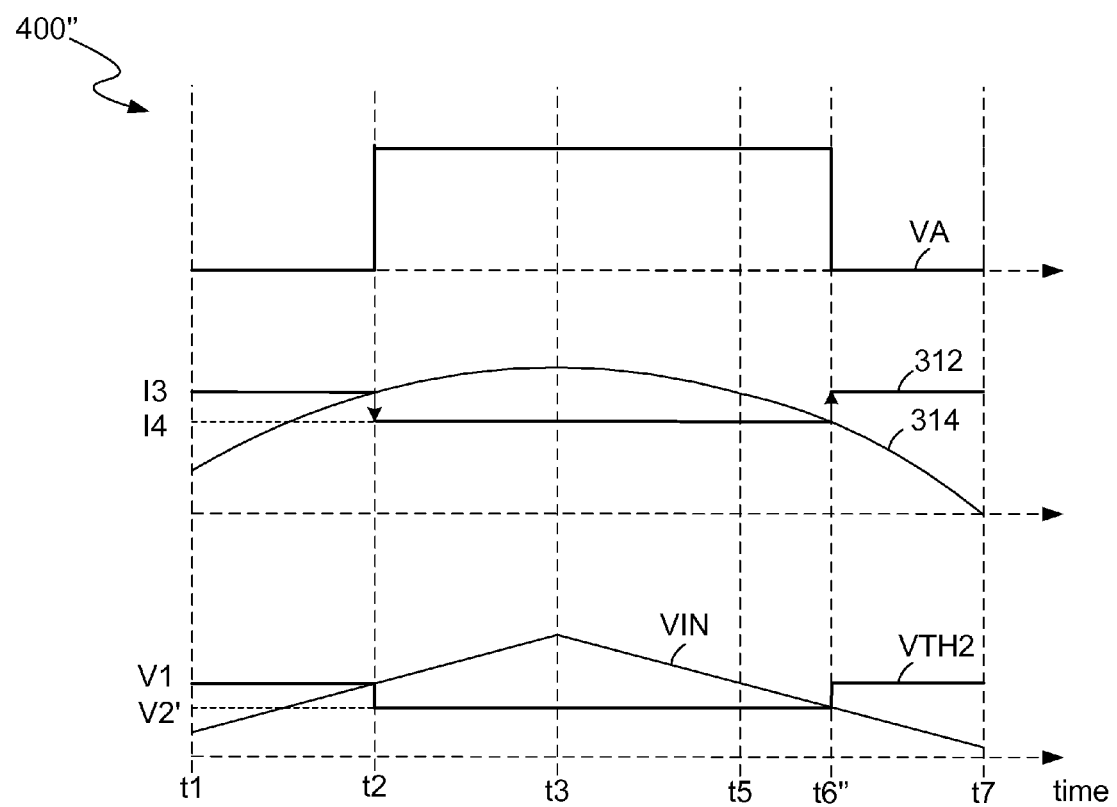
FIG. 3D illustrates another timing diagram of signals received and generated by a voltage detection circuit, in accordance with one embodiment of the present invention.

FIG. 3D illustrates another timing diagram 400'' of signals received and generated by the voltage detection circuit 300 of FIG. 3A, in accordance with one embodiment of the present invention. FIG. 3D is described in combination with FIG. 3A. The timing diagram 400'' shows the detection signal VA, the threshold current 312, the monitoring current 314, and the input voltage VIN.

In the example of FIG. 3D, the threshold current 312 varies according to the condition of the input voltage VIN. More specifically, in one embodiment, the current generator 302 provides a compensation current to compensate the threshold current 312 if the detection signal VA is in the first state, e.g., the low electrical level. As such, the threshold current 312 has a level I3 if VA is in the first state and has a level I4 if VA is in the second state, where I4 is less than I3.

During the time t1 to t2, the detection signal VA having the low electrical level indicates that the input voltage VIN is less than the voltage threshold VTH2 (VTH2=V1). As such, the current generator 302 provides a compensation current proportional to the temperature to compensate the threshold current 312. Thus, the threshold current 312 has the level I3. At time t2, the input voltage VIN is equal to the level V1. Thus, the monitoring current 314 reaches the threshold current 312 having the level I3. As such, the state of the detection signal VA can be switched to the high electrical level from time t2. Once the state of the detection signal VA is changed to the high electrical level, the current generator 302 does not provide the compensation current. As such, the threshold current 312 is adjusted to the level I4 that is less than the monitoring current 314. Advantageously, even if the noise of the voltage detection circuit 300 may cause some slight variation of the input voltage VIN or the monitoring current 314, the monitoring current 314 will not drop to the threshold current 312, in one embodiment. Accordingly, the detection signal VA can remain at the high electrical level. In other words, the level I4 can be properly chosen such that the variation of the input voltage or the monitoring current caused by the noise of the voltage detection circuit 300 can be neglected and will not affect the detection signal VA. Therefore, the oscillations of the detection signal VA can be reduced or avoided.

Since the voltage threshold VTH2 varies in accordance with the threshold current 312, the voltage threshold VTH2 is changed from V1 to V2', where V2' is less than V1.

At time t6'', the input voltage VIN is decreased to the level V2'. Thus, the monitoring current 314 is decreased to the threshold current 312 having the level I4. As such, the state of the detection signal VA can be switched to the low electrical level from time t6''. Once the state of the detection signal VA is changed to the low electrical level, the threshold current 312 is adjusted to the level I3. Similarly, the voltage threshold VTH2 can be changed to the level V1 accordingly. Advantageously, even if the noise of the voltage detection circuit 300 may cause some slight variation of the input voltage VIN or the monitoring current 314, the monitoring current 314 will not increase to the threshold current 312, in one embodiment. Accordingly, the detection signal VA can remain at the low electrical level. In other words, the level I3 can be properly chosen such that the variation of the input voltage or the monitoring current caused by the noise of the voltage detection circuit 300 can be neglected and will not affect the detection signal VA. Therefore, the oscillations of the detection signal VA can be reduced or avoided, which can improve the stability of the voltage detection circuit 300.

Although specific waveforms are given in FIG. 3B, FIG. 3C and FIG. 3D, signals received or generated by the voltage detection circuit 300 can have other waveforms in accordance with electronic components employed by the voltage detection circuit 300, and are not limited to the examples of FIG. 3B, FIG. 3C and FIG. 3D. For example, the monitoring current 314 can be decreased as the input voltage VIN increases. Moreover, the waveform of the monitoring current 314 can be a linear curve, e.g., a straight increment or decrement line, according to electronic components contained in the voltage-to-current generator 306.

Figure 4:
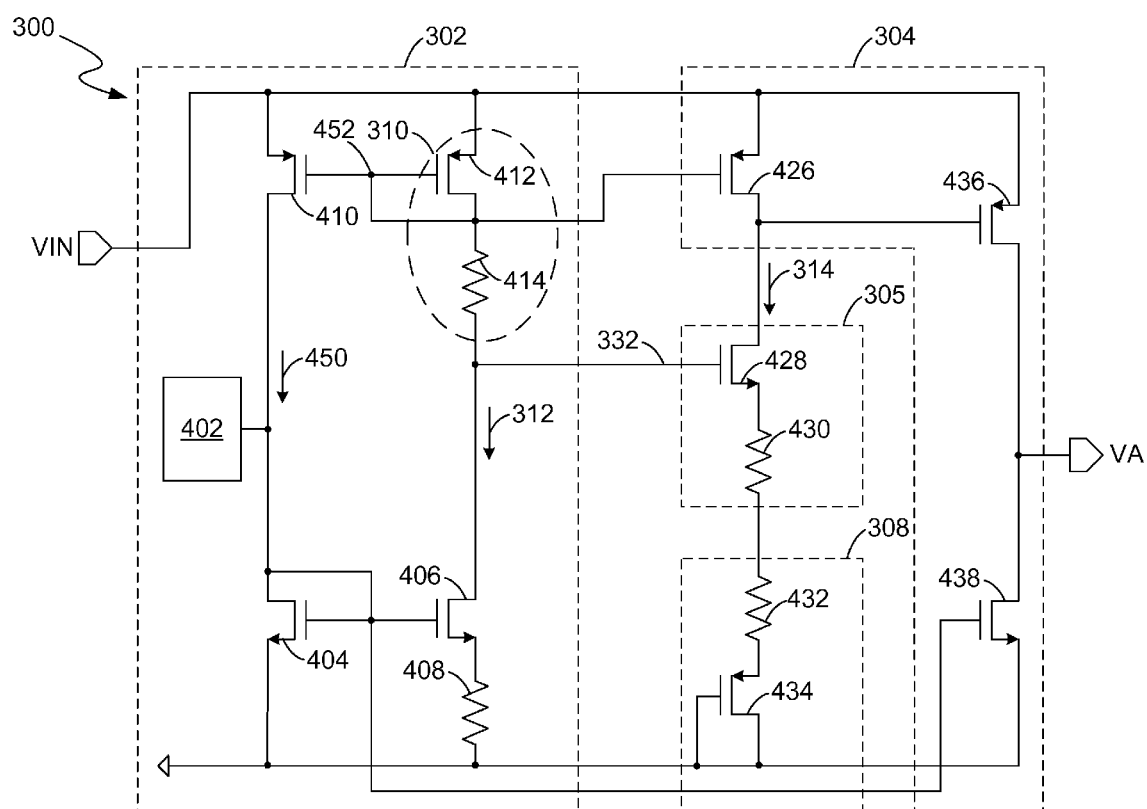
FIG. 4 illustrates an example of a voltage detection circuit, in accordance with one embodiment of the present invention.

FIG. 4 illustrates an example of the voltage detection circuit 300 of FIG. 3A, in accordance with one embodiment of the present invention. Elements labeled the same as in FIG. 3A have similar functions. FIG. 4 is described in combination with FIG. 3A and FIG. 3B.

In the example of FIG. 4, the current generator 302 includes a start-up circuit 402, one or more transistors such as transistors 404, 406, 410 and 412, and one or more resistors such as a resistor 408 and a resistor 414. The start-up circuit 402 can generate a start-up signal (e.g., a digital one signal or an analog signal) during a start-up duration of the voltage detection circuit 300.

The current generator 302 is operable for generating the threshold current 312 that is approximately proportional to the temperature. In one embodiment, the transistor 410 and the transistor 412 can be P-type metal-oxide semiconductor field effect (PMOS) transistors, and the transistor 404 and the transistor 406 can be N-type metal-oxide semiconductor field effect (NMOS) transistors. The transistor 410 and the transistor 412 coupled together can constitute a current mirror for mirroring the threshold current 312 flowing through the transistor 412 to the current 450 flowing through the transistor 410. Therefore, the current 450 can be approximately equal to the threshold current 312.

In addition, the diode-connected transistor 404 has a gate terminal coupled to a gate terminal of the transistor 406. The resistor 408 is coupled in series with the transistor 406. Therefore, a gate-source voltage V_gs1 of the transistor 404 can be equal to a gate-source voltage V_gs2 of the transistor 406 plus a voltage across the resistor 408, which can be given by:

$$V\_gs1 = V\_gs2 + I*R, \quad (1)$$

where I represents a level of the threshold current 312 that flows through the transistor 406 and the resistor 408, R represents resistance of the resistor 408. According to equation (1), the level of the threshold current 312 can be given by:

$$I = (V\_gs1 - V\_gs2)/R. \quad (2)$$

In one embodiment, the transistor 404 and the transistor 406 can operate in a sub-threshold region, in which a difference between the gate-source voltage V_gs1 and the gate-source voltage V_gs2 can be given by:

$$(V\_gs1 - V\_gs2) = n*K*T*In(S)/q, \quad (3)$$

where n represents a slop factor, K represents boltzmann constant, T represents the absolute temperature of the voltage detection circuit 300, S represents a size ratio of the transistor 404 and the transistor 406 (e.g., a width-to-length ratio of the transistor 404 to the width-to-length ratio of the transistor 406), and q represents an electron charge value. If "n*K*In(S)/q" is substituted by a substantially constant value A, the equation (2) can be rewritten as equation (4):

$$I=(A/R)*T. \quad (4)$$

As shown in equation (4), the threshold current 312 can be approximately proportional to the absolute temperature. Advantageously, if the transistor 406 operates in a sub-threshold region, the level of the threshold current 312 can be reduced. Moreover, the threshold current 312 may not be affected by the input voltage VIN according to the equation (4), such that the power consumption of the voltage detection circuit 300 can be reduced.

In the example of FIG. 4, the voltage sense circuit 310 constituted by the transistor 412 and the resistor 414 is included in the current generator 302. The current generator 302 can employ the transistor 412 to generate the threshold current 312. In one embodiment, the voltage sense circuit 310 can provide a bandgap voltage VB1, and can generate the sense signal 332 based on the bandgap voltage VB1 and the input voltage VIN.

More specifically, the transistor 412 and the resistor 414 can constitute a bandgap voltage generator and can employ the threshold current 312 to generate the bandgap voltage VB1. As the threshold current 312 flowing through the resistor 414 is approximately proportional to the absolute temperature, a voltage of the resistor 414 can have a positive temperature coefficient. Additionally, a gate-source voltage of the transistor 412 can have a negative temperature coefficient due to a negative temperature characteristic of a forbidden region width of silicon in complementary metal-oxide-semiconductor (CMOS) technology. Therefore, a sum of the voltage across the resistor 414 and the gate-source voltage of the transistor 412 can be a bandgap voltage VB1 which remains substantially constant if the temperature varies. The sense signal 332 representing a difference between the input voltage VIN and the bandgap voltage VB1, e.g., V_SENSE=VIN−VB1, can be used to indicate the input voltage VIN.

As described in relation to FIG. 3A, when the monitoring current 314 is equal to the threshold current 312, it indicates that the voltage V_SENSE of the sense signal 332 is equal to the voltage threshold VTH1 and the input voltage VIN is equal to the voltage threshold VTH2. In the example of FIG. 4, since V_SENSE=VIN−VB1, VTH2 is equal to VTH1 plus VB1, e.g., VTH2=VTH1+VB1. The current generator 302 and the voltage sense circuit 310 can have other configurations, and is not limited to the example of FIG. 4.

In one embodiment, the bandgap voltage generator 308 includes a diode-connected transistor 434 and a resistor 432 coupled in series. The monitoring current 314 can flow through the bandgap voltage generator 308. Similar to the voltage sense circuit 310, the bandgap voltage generator 308 can employ the monitoring current 314 to generate a bandgap voltage VB3 if the monitoring current 314 is equal to the threshold current 312.

The bandgap voltage generator 308 can include other components, and is not limited to the example of FIG. 4. For example, the bandgap voltage generator 308 can include multiple series-connected bandgap units. Each bandgap unit includes a diode-connected transistor and a resistor coupled in series. As such, the bandgap voltage VB3 can be determined by multiple bandgap voltages, e.g., VB3 can be equal to a sum of the bandgap voltages generated by the multiple bandgap units. In addition, the bandgap voltage generator 308 can include multiple bipolar transistors and resistors, and is not limited to the MOS transistors in the example of FIG. 4.

The amplifier 305 is capable of adjusting the monitoring current 314 according to the sense signal 332, and generating a bandgap voltage VB2 if the monitoring current 314 is equal to the threshold current 312. In one embodiment, the amplifier 305 includes a transistor 428 and a resistor 430 coupled in series. The transistor 428, e.g., an NMOS transistor, has a gate terminal coupled to the current generator 302 for receiving the sense signal 332. The transistor 428 can work in multiple operation regions according to the sense signal 332.

The current comparator 304 is operable for comparing the monitoring current 314 to the threshold current 312, and for generating the detection signal VA based on a result of the comparison. In one embodiment, the current comparator 304 includes a transistor 426, a transistor 436, and a transistor 438. The transistor 426 and the transistor 412 can constitute a current mirror for mirroring the threshold current 312 to the monitoring current 314. The transistor 426 can work in multiple operation regions according to the monitoring current 314 and the threshold current 312. In one embodiment, the current generator 302 can determine a maximum level of the monitoring current 314 according to the threshold current 312. For example, the transistors 426 and 412 mirror the threshold current 312 to the monitoring current 314, such that the maximum level of the monitoring current 314 can be equal to the threshold current 312.

More specifically, in one embodiment, if the voltage V_SENSE of the sense signal 332 is less than the voltage threshold VTH1, e.g., when VIN<VTH2, the transistor 428 operates in a cut-off region. Accordingly, the monitoring current 314 is less than the threshold current 312, which enables the transistor 426 to work in a linear region. Thus, a source-drain voltage of the transistor 426 drops below a predetermined threshold, e.g., the voltage threshold of the transistor 436, to switch off the transistor 436. Consequently, the output terminal of the current comparator 304 is connected to ground by the transistor 438. Therefore, the detection signal VA having a low electrical level can be generated to indicate that the input voltage VIN is less than the voltage threshold VTH2.

If the voltage V_SENSE is equal to the voltage threshold VTH1, e.g., when VIN=VTH2, the transistor 428 works in a sub-threshold region. Since the transistor 426 mirrors the threshold current 312 to the monitoring current 314, the monitoring current 314 is equal to the threshold current 312. Similar to the bandgap voltage generator 308, the transistor 428 and the resistor 430 constitute a bandgap voltage generator to generate the bandgap voltage VB2. As such, the voltage threshold VTH1 can be set to a bandgap voltage, e.g., VB2+VB3. Accordingly, the voltage threshold VTH2 can also be set to a bandgap voltage, e.g., VB1+VB2+VB3.

If the voltage V_SENSE is greater than VTH1, e.g., when VIN>VTH2, the transistor 428 works in a linear region. The monitoring current 314 reaches the maximum level, e.g., the threshold current 312, which enables the transistor 426 to work in a saturation region. Thus, the source-drain voltage of the transistor 426 can be greater than the voltage threshold of the transistor 436, which can turn on the transistor 436. Accordingly, the current comparator 304 generates a high level electrical signal indicating that the input voltage VIN is greater than the voltage threshold VTH2. The current comparator 304 and the voltage-to-current converter 306 can have other configurations, and is not limited to the example of the FIG. 4.

Advantageously, the voltage comparator (e.g., the voltage comparator 104 of FIG. 1 or the voltage comparator 204 of FIG. 2) in the conventional under-voltage detection circuit can be substituted by the voltage-to-current converter 306 and the current comparator 304 which can have less current branches consuming energy. Moreover, since the voltage threshold VTH2 is a bandgap voltage which can remain substantially constant even if the temperature varies, the detection accuracy of the voltage detection circuit 300 can be improved.

Figure 5:
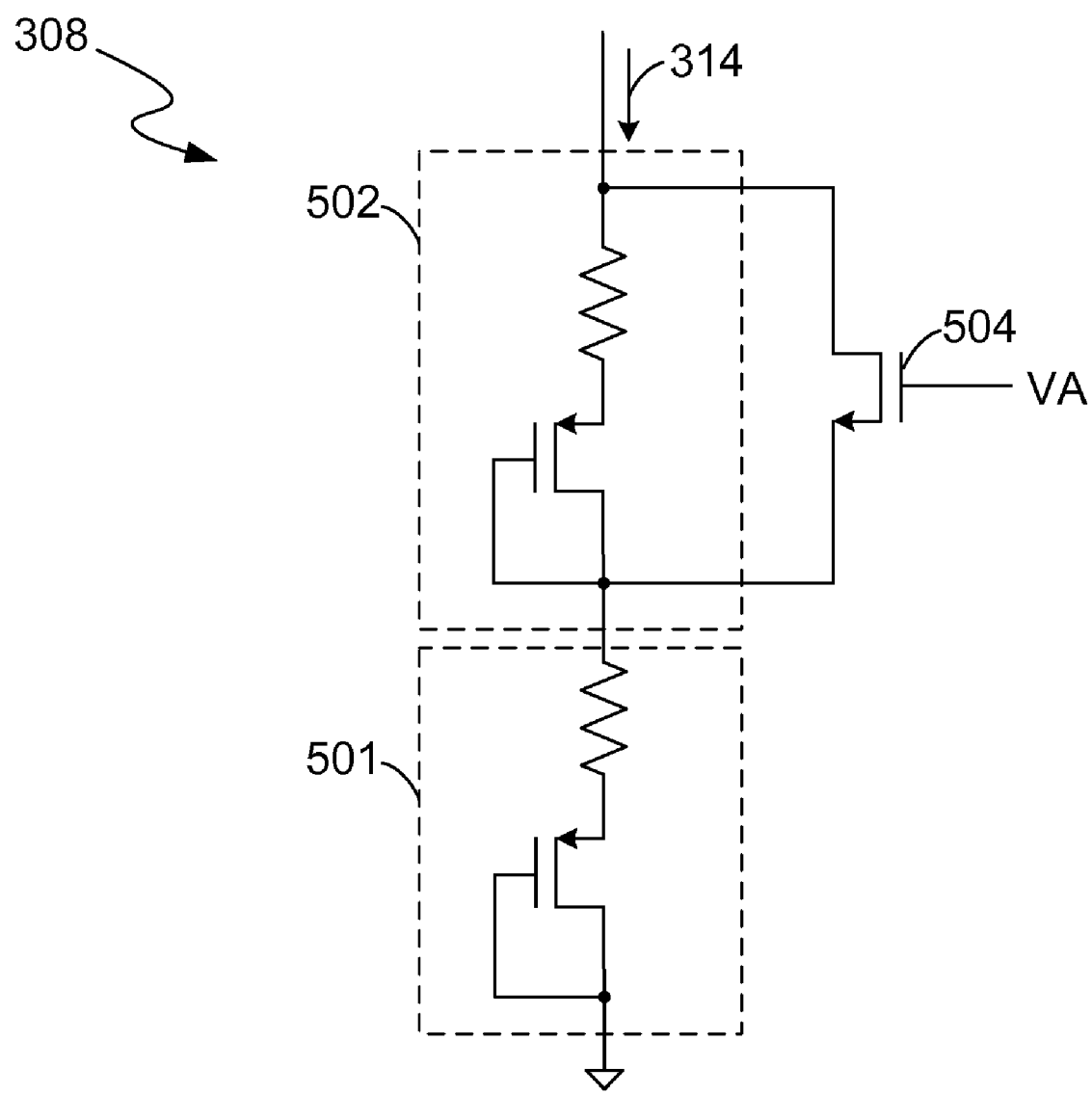
FIG. 5 illustrates an example of a bandgap voltage generator, in accordance with one embodiment of the present invention.

FIG. 5 illustrates another example of the bandgap voltage generator 308 of FIG. 3A, in accordance with one embodiment of the present invention. Elements labeled the same as in FIG. 3A and FIG. 4 have similar functions. FIG. 5 is described in combination with FIG. 3A and FIG. 4.

In the example of FIG. 5, the bandgap voltage generator 308 has a hysteretic function. The bandgap voltage VB3 has a level selected from multiple levels such as a level VB3_1 and a level VB3_2. In one embodiment, the bandgap voltage generator 308 includes a bandgap unit 501, a bandgap unit 502, and a switch 504. The bandgap unit 501 can generate a bandgap voltage VB4 if the monitoring current 314 flows through the bandgap unit 501. The bandgap unit 502 coupled in series with the bandgap unit 501 can provide a bandgap voltage VB5 if the monitoring current 314 flows through the bandgap unit 502. In one embodiment, the switch 504 can receive the detection signal VA indicative of the condition of the input voltage VIN and can control the bandgap unit 502 accordingly.

The bandgap voltage generated by the bandgap voltage generator 308 varies in accordance with the detection signal VA. More specifically, if the detection signal VA has the first state, e.g., the low electrical level, indicating that the input voltage VIN is less than the voltage threshold VTH2, the switch 504 is turned off. The monitoring current 314 flows through the bandgap unit 502 and the bandgap unit 501 simultaneously. Thus, the bandgap voltage VB3 can have the level VB3_1 that is equal to the bandgap voltage VB4 plus the bandgap voltage VB5. Meanwhile, the voltage threshold VTH2 can be set to VB1+VB2+VB3_1, e.g., VTH2=VB1+VB2+VB4+VB5, accordingly.

If the detection signal VA has the second state, e.g., the high electrical level, indicating that the input voltage VIN is greater than the voltage threshold VTH2, the switch 504 can be turned on. The monitoring current 314 flows through the switch 504 and the bandgap unit 501. Thus, the bandgap voltage VB3 has the level VB3_2 that is equal to the bandgap voltage VB4. The level VB3_2 is less than the level VB3_1, in one embodiment. As such, the voltage threshold VTH2 can be set to VB1+VB2+VB3_2, e.g., VTH2=VB1+VB2+VB4, accordingly.

Figure 6:
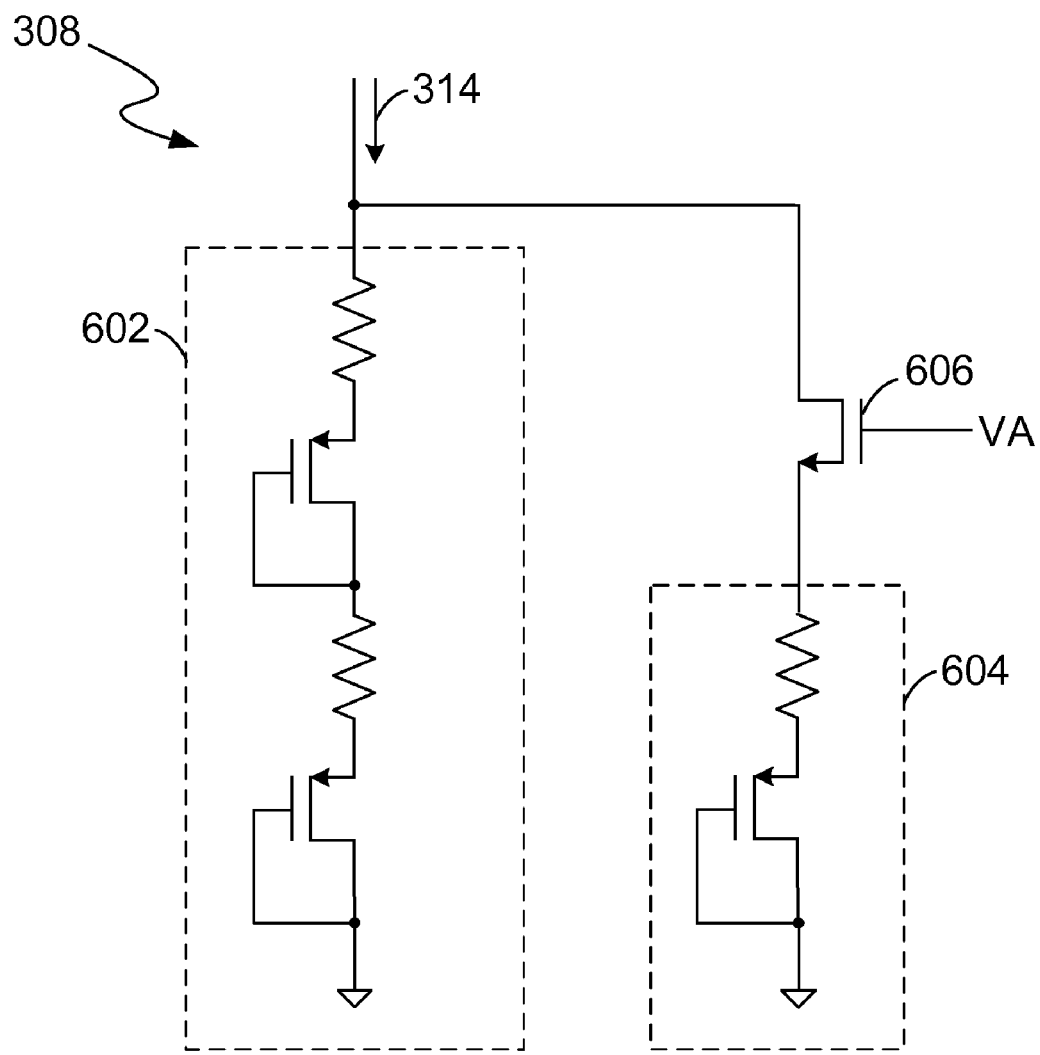
FIG. 6 illustrates another example of a bandgap voltage generator, in accordance with one embodiment of the present invention.

FIG. 6 illustrates another example of the bandgap voltage generator 308 of FIG. 3A, in accordance with one embodiment of the present invention. Elements labeled the same as in FIG. 3A and FIG. 4 have similar functions. FIG. 6 is described in combination with FIG. 3A and FIG. 4.

In the example of FIG. 6, the bandgap voltage generator 308 also has a hysteretic function. The bandgap voltage VB3 has a level selected from multiple levels such as VB3_1 and VB3_2. In one embodiment, the bandgap voltage generator 308 includes a bandgap unit 602, a bandgap unit 604, and a switch 606. The switch 606 is coupled in series with the bandgap unit 604. The switch 606 and the bandgap unit 604 are coupled in parallel with the bandgap unit 602. The bandgap unit 602 can generate a bandgap voltage VB6 if the monitoring current 314 flows through the bandgap unit 602. The bandgap unit 604 can generate a bandgap voltage VB7 if the monitoring current 314 flows through the bandgap unit 604. The switch 606 can receive the detection signal VA and can control the bandgap unit 602 and the bandgap unit 604 accordingly.

The bandgap voltage generated by the bandgap voltage generator 308 varies in accordance with the detection signal VA. For example, if the detection signal VA has the first state, e.g., the low electrical level, indicating that the input voltage VIN is less than the voltage threshold VTH2, the switch 606 can be turned off. As such, the monitoring current 314 flows through the bandgap unit 602. The bandgap voltage VB3 can have the level VB3_1 that is equal to VB6. The voltage threshold VTH2 can be set to VB1+VB2+VB3_1, e.g., VTH2=VB1+VB2+VB6, accordingly.

If the detection signal VA has the second state, e.g., the high electrical level, indicating that the input voltage VIN is greater than the voltage threshold VTH2, the switch 606 can be turned on. Compared to the bandgap unit 604, the bandgap unit 602 having more transistors and resistors needs a higher working voltage to be conducted. Thus, the transistors in the bandgap unit 602 can be automatically switched off. The monitoring current 314 can flow through the switch 606 and the bandgap unit 604. As such, the bandgap voltage VB3 has the level VB3_2 that is equal to the bandgap voltage VB7. The level VB3_2 is less than the level VB3_1. Meanwhile, the voltage threshold VTH2 can be set to VB1+VB2+VB3_2, e.g., VTH2=VB1+VB2+VB7, accordingly. The bandgap voltage generator 308 can have other configurations, and is not limited to the example of FIG. 4, FIG. 5 and FIG. 6.

Figure 7:
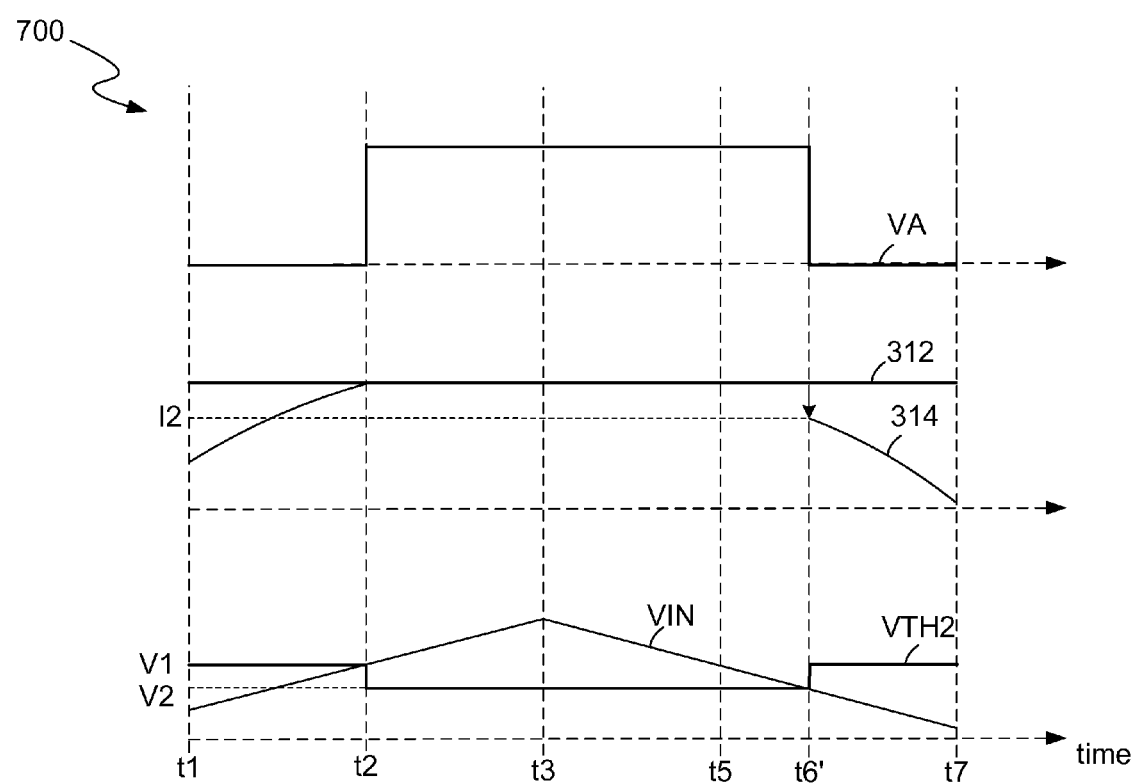
FIG. 7 illustrates another timing diagram of signals received and generated by a voltage detection circuit, in accordance with one embodiment of the present invention.

FIG. 7 illustrates another timing diagram 700 of signals received and generated by the voltage detection circuit 300 using the bandgap voltage generator in FIG. 5 or FIG. 6, in accordance with one embodiment of the present invention. FIG. 7 is described in combination with FIG. 3C, FIG. 4, FIG. 5 and FIG. 6. The timing diagram 700 shows the detection signal VA, the threshold current 312, the monitoring current 314, and the input voltage VIN.

At time t2, the monitoring current 314 reaches the maximum level. In one embodiment, the maximum level is equal to the threshold current 312. At time t2, the bandgap voltage VB3 is changed from the level VB3_1 to the level VB3_2. Thus, the voltage threshold VTH2 is changed from the level V1 to V2. The transistor 428 operates in the sub-threshold region at time t2. After time t2, the transistor 428 can stay in the linear region until the input voltage VIN drops to the voltage threshold VTH2, e.g., at time t6'. In another word, the monitoring current 314 remains to be equal to the threshold current 312 until the input voltage VIN is less than the level V2. As such, even if the noise of the voltage detection circuit 300 may cause some slight variation of the input voltage VIN, the monitoring current 314 can be equal to the threshold current 312, and will not drop below the threshold current 312. Therefore, the oscillations of the detection signal VA can be reduced or avoided.

At time t6', the input voltage VIN is decreased to the voltage threshold VTH2. Accordingly, the monitoring current 314 is decreased to the level I2 which is less than the threshold current 312. Thus, the voltage threshold VTH2 is changed from V2 to V1. From time t6', a gate-source voltage of the transistor 428 is decreased accordingly, and thus the transistor 428 operates in the cut-off region. As a result, the oscillations of the detection signal VA can be reduced or avoided.

Figure 8:
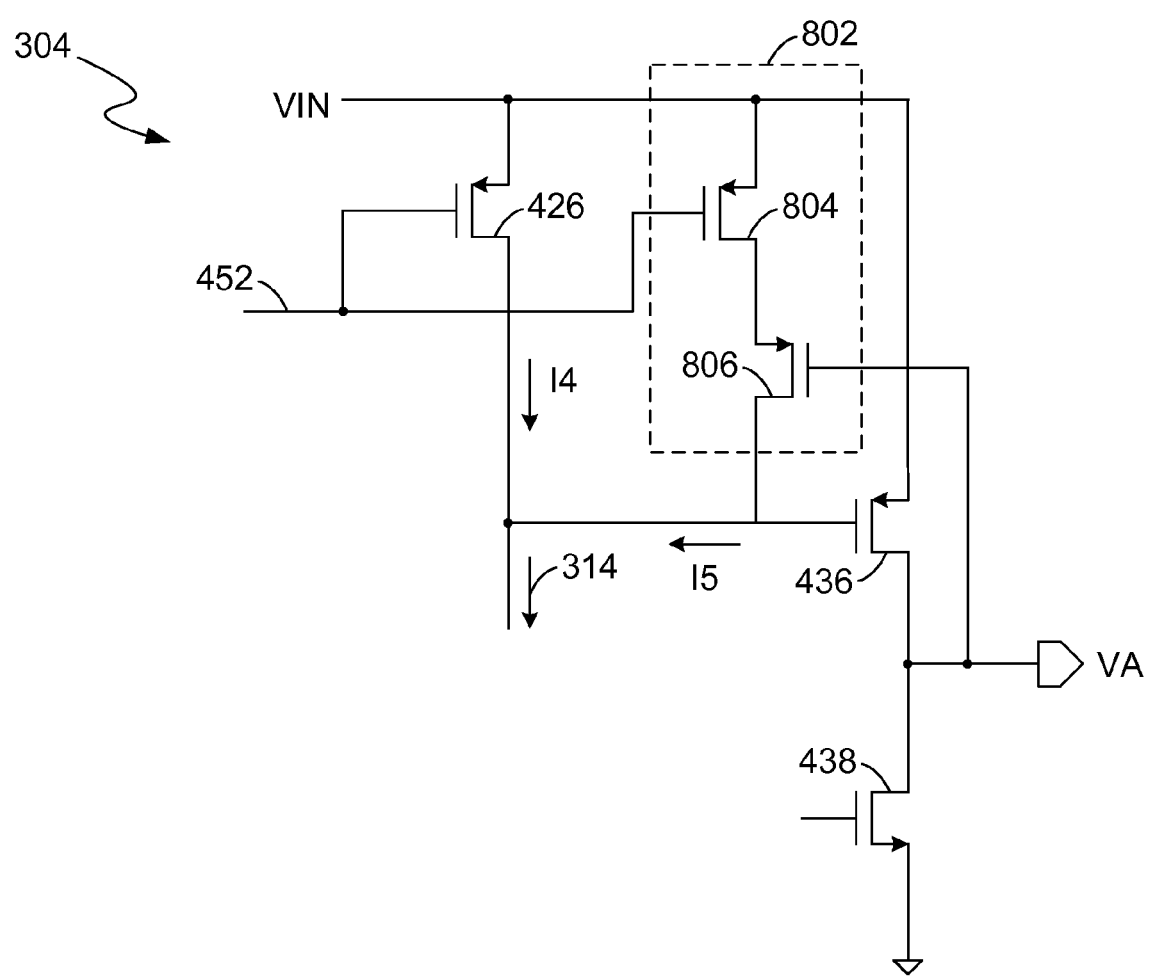
FIG. 8 illustrates an example of the current comparator, in accordance with one embodiment of the present invention.

FIG. 8 illustrates another example of the current comparator 304 of FIG. 3A, in accordance with one embodiment of the present invention. Elements labeled the same as in FIG. 3A and FIG. 4 have similar functions. FIG. 8 is described in combination with FIG. 3A, FIG. 3D and FIG. 4.

In the example of FIG. 8, the current comparator 304 includes a current compensator 802 operable for providing a compensation current to compensate the threshold current 312 according to the condition of the input voltage VIN. As such, the threshold current 312 varies according to the condition of the input voltage VIN, which allows the voltage-to-current converter 306 to provide a hysteretic function, e.g., the voltage threshold VTH2 varies according to the condition of the input voltage VIN.

More specifically, in one embodiment, the current compensator 802 can include a transistor 804 and a switch 806. The transistor 804 has a gate terminal coupled to the gate terminal 452 of the transistor 412 of FIG. 4. Therefore, the transistor 804 and the transistor 412 constitute a current mirror for mirroring the threshold current 312 to the compensation current having a level I5. As such, the compensation current can also be approximately proportional to the temperature. The switch 806 receives the detection signal VA and controls the compensation current accordingly.

By way of example, if VA has the first state, e.g., the low electrical level, indicating that the input voltage VIN is less than the voltage threshold VTH2, the switch 806 is turned on. The transistor 426 and the transistor 412 mirror the threshold current 312 to the current level I4. The transistor 804 and the transistor 412 mirror the threshold current 312 to the current level I5 to compensate the threshold current 312. As such, the current comparator 304 can determine the state of the voltage detection signal VA by comparing the monitoring current 314 to the threshold current 312 having the level I3, where I3 is equal to a sum of I4 and I5. For example, VA can be switched from the first state to the second state if the monitoring current 314 is equal to the level I3 that is greater than I4.

If VA has the second state, e.g., the high electrical level, indicating that the input voltage VIN is greater than the voltage threshold VTH2, the switch 806 is turned off. The transistor 426 and the transistor 412 mirror the threshold current 312 to the current level I4. Therefore, the current comparator 304 can determine the state of the voltage detection signal VA by comparing the monitoring current 314 to the threshold current 312 having the level I4. For example, VA can be switched from the second state to the first state if the monitoring current 314 is equal to the level I4.

As such, the voltage threshold VTH2 is adjusted according to the threshold current 312. For example, if VA is in the first state, the voltage threshold VTH2 is equal to the level V1. If VA is in the second state, the voltage threshold VTH2 is equal to the level V2'. The current compensator 802 can have other configurations, and is not limited to the example of FIG. 8. For example, the current compensator 802 can provide the compensation current if VA has the high electrical level.

Advantageously, by employing the current comparator 304 in FIG. 8, resistors in the voltage-to-current converter 306, e.g., the resistor 430 and 432, can have relatively small resistance to provide the bandgap voltage VB2+VB3. Thus, the chip size and cost of the voltage detection circuit 300 can be further reduced. Moreover, the voltage threshold VTH2 varies according to the threshold current 312, e.g., the voltage threshold VTH2 can be changed by adjusting the threshold current 312 according to the voltage condition of input voltage VIN. Therefore, the oscillations of the voltage detection circuit 300 can be reduced or avoided, which can improve the stability of the voltage detection circuit 300.

Figure 9:
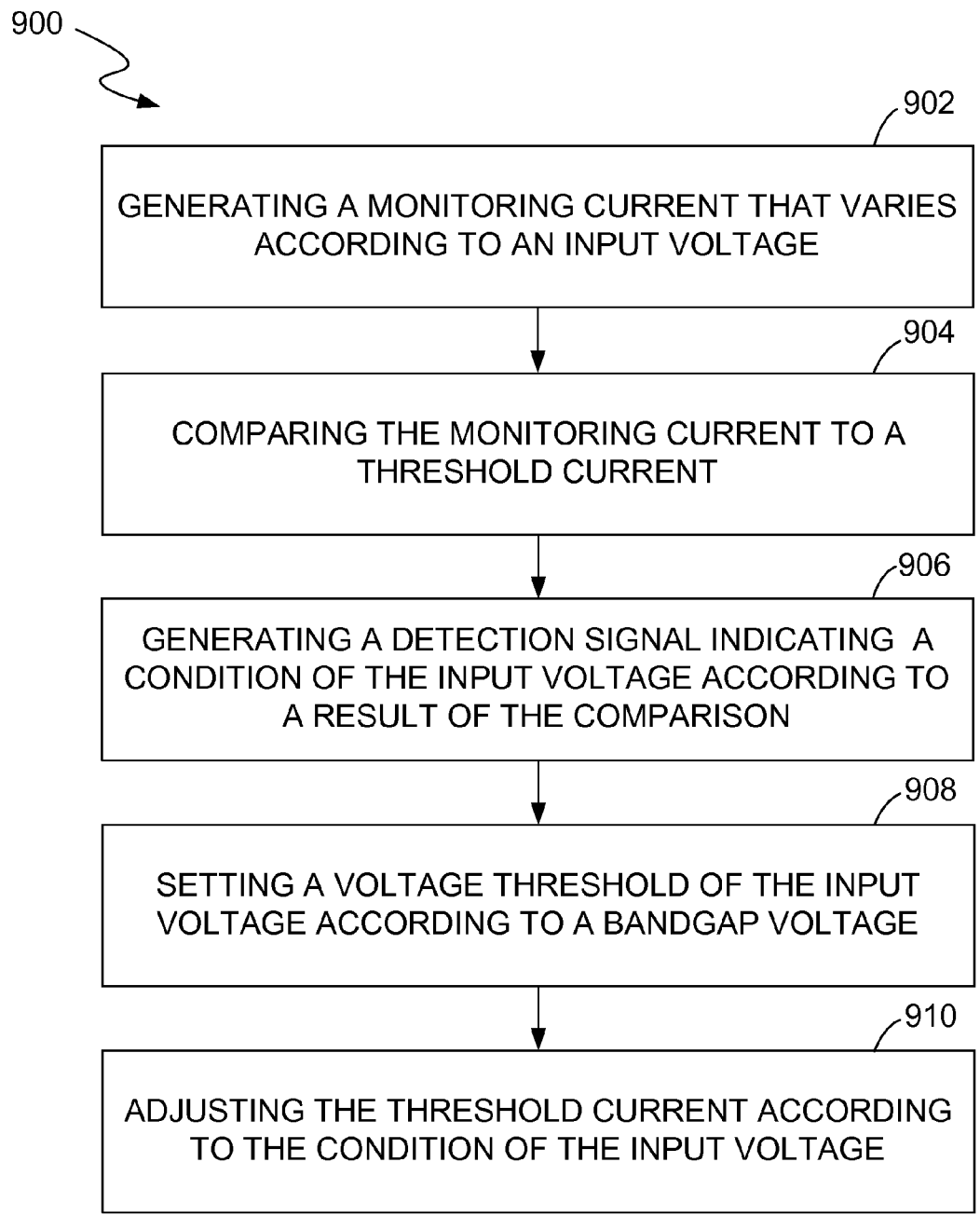
FIG. 9 illustrates a flowchart of operations performed by a voltage detection circuit, in accordance with one embodiment of the present invention.

FIG. 9 illustrates a flowchart 900 of operations performed by the voltage detection circuit 300, in accordance with one embodiment of the present invention. FIG. 9 is described in combination with FIG. 3A-FIG. 8. Although specific steps are disclosed in FIG. 9, such steps are exemplary. That is, the present invention is well suited to performing various other steps or variations of the steps recited in FIG. 9.

In block 902, a monitoring current, e.g., the monitoring current 314, that varies according to an input voltage, e.g., the input voltage VIN, is generated. In one embodiment, the voltage sense circuit 310 can provide a bandgap voltage VB1, and can generate the sense signal 332 indicative of the input voltage VIN based on the bandgap voltage VB1 and the input voltage VIN. The monitoring current 314 is generated based on the sense signal 332.

In block 904, the monitoring current is compared to a threshold current, e.g., the threshold current 312.

In block 906, a voltage detection signal, e.g., the detection signal VA, indicating a voltage condition of the input voltage is generated according to a result of the comparison.

In block 908, a voltage threshold, e.g., the voltage threshold VTH2, of the input voltage is set according to a bandgap voltage, e.g., VB1+VB2+VB3. The monitoring current 314 is equal to the threshold current 312 if the input voltage VIN is equal to the voltage threshold VTH2. In one embodiment, the bandgap voltage is set to a first level, e.g., VB1+VB2+VB3_2, if the input voltage VIN is greater than the voltage threshold VTH2. The bandgap voltage is set to a second level, e.g., VB1+VB2+VB3_1, if the input voltage VIN is less than the voltage threshold VTH2. In one embodiment, the monitoring current 314 is adjusted according to the voltage threshold VTH2.

In block 910, the threshold current is adjusted according to the condition of the input voltage. In one embodiment, the threshold current 312 is set to a first level, e.g., I4, if the input voltage VIN is greater than the voltage threshold VTH2. The threshold current 312 is set to a second level, e.g., I3, if the input voltage VIN is less than the voltage threshold VTH2.

Figure 10:
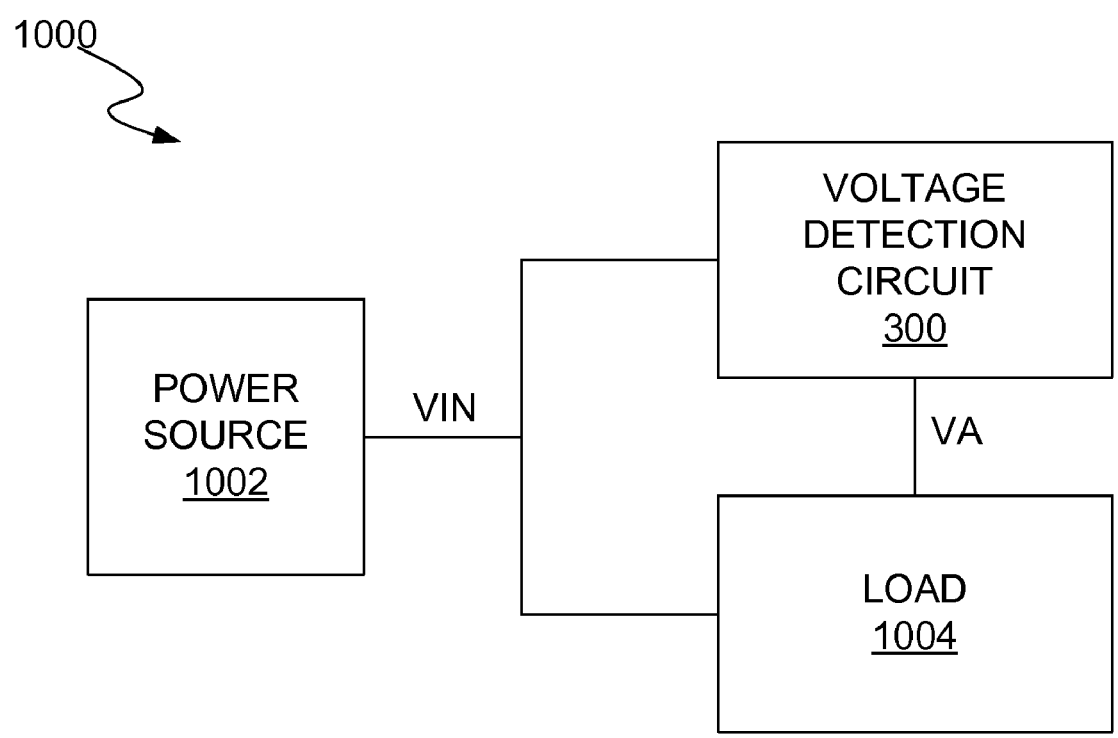
FIG. 10 illustrates a block diagram of an electronic system, in accordance with one embodiment of the present invention.

FIG. 10 illustrates a block diagram of an electronic system 1000, in accordance with one embodiment of the present invention. In the example of FIG. 10, the electronic system 1000 includes a power source 1002, a voltage detection circuit 300, and a load 1004. The power source 1002, e.g., a battery pack, is capable of supplying electrical power having a voltage VIN to drive the voltage detection circuit 300 and the load 1004. The load 1004 (e.g., an electric vehicle or a computer) can receive the electrical power and can perform various functions. The voltage detection circuit 300 can employ the architecture disclosed in FIG. 3A-FIG. 8. The voltage detection circuit 300 can detect the voltage VIN, and can generate a detection signal VA indicating a voltage condition of the input voltage VIN. In one embodiment, the load 1004 can control the power according to the detection signal VA. For example, the load 1004 can automatically cut off the power if the detection signal VA indicates that the input voltage VIN is greater than a predetermined threshold, e.g., an over-voltage condition. Alternatively, a light source, e.g., a light-emitting diode (LED) light source, of the load 1004 can be turned on to remind the user to charge the power source 1002 if the detection signal VA indicates that the input voltage VIN is less than a predetermined threshold, e.g., an under-voltage condition.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A circuit for detecting an input voltage, said circuit comprising:
   a voltage-to-current converter operable for generating a monitoring current that varies in accordance with said input voltage; and
   a current comparator coupled to said voltage-to-current converter and operable for comparing said monitoring current to a threshold current that is proportional to temperature of said circuit, and for generating a detection signal based on a result of said comparison, said detection signal indicating a comparison result between said input voltage and a voltage threshold,
wherein said circuit controls said monitoring current and said threshold current based on said detection signal.

2. The circuit as claimed in claim 1, further comprising:
a voltage sense circuit coupled to said voltage-to-current converter and operable for providing a bandgap voltage, and for generating a sense signal indicative of said input voltage based on said bandgap voltage and said input voltage, wherein said monitoring current is generated based on said sense signal.

3. The circuit as claimed in claim 1, further comprising a metal-oxide semiconductor field effect transistor, and wherein said metal-oxide semiconductor field effect transistor operates in a sub-threshold region to generate said threshold current.

4. The circuit as claimed in claim 1, further comprising:
a current generator coupled to said current comparator and operable for generating said threshold current, wherein said current generator determines a maximum level of said monitoring current according to said threshold current.

5. The circuit as claimed in claim 1, wherein said input voltage is equal to said voltage threshold if said monitoring current is equal to said threshold current, and wherein said voltage-to-current converter is operable for providing a bandgap voltage and for setting said voltage threshold according to said bandgap voltage.

6. The circuit as claimed in claim 5, wherein said bandgap voltage varies according to said detection signal to adjust said monitoring current.

7. The circuit as claimed in claim 5, wherein said bandgap voltage has a level selected from at least a first level and a second level, and wherein said bandgap voltage has said first level if said input voltage is greater than said voltage threshold, and wherein said bandgap voltage has said second level if said input voltage is less than said voltage threshold.

8. The circuit as claimed in claim 5, wherein said threshold current has a level selected from at least a first level and a second level, and wherein said threshold current has said first level if said input voltage is greater than said voltage threshold, and wherein said threshold current has said second level if said input voltage is less than said voltage threshold.

9. A method for comparing an input voltage with a voltage threshold, comprising:
generating a monitoring current that varies according to said input voltage;
comparing said monitoring current to a threshold current proportional to temperature;
generating a detection signal according to a result of said comparison, said detection signal indicating a comparison result between said input voltage and said voltage threshold; and
controlling said monitoring current and said threshold current based on said detection signal.

10. The method as claimed in claim 9, wherein the step of generating said monitoring current further comprises:
generating a sense signal indicative of said input voltage based on a bandgap voltage and said input voltage; and
generating said monitoring current according to said sense signal.

11. The method as claimed in claim 9, further comprising:
providing a bandgap voltage; and
setting said voltage threshold according to said bandgap voltage,
wherein said input voltage is equal to said voltage threshold if said monitoring current is equal to said threshold current.

12. The method as claimed in claim 11, further comprising:
setting said bandgap voltage to a first level if said input voltage is greater than said voltage threshold; and
setting said bandgap voltage to a second level if said input voltage is less than said voltage threshold.

13. The method as claimed in claim 9, further comprising:
setting said threshold current to a first level if said input voltage is greater than said voltage threshold; and
setting said threshold current to a second level if said input voltage is less than said voltage threshold.

14. An electronic system comprising:
a load being driven by a power having an input voltage; and
a detection circuit coupled to said load and operable for comparing said input voltage with a voltage threshold, said detection circuit comprising:
a voltage-to-current converter operable for generating a monitoring current that varies according to said input voltage, operable for providing a bandgap voltage, and operable for setting said voltage threshold to be equal to said bandgap voltage; and
a current comparator coupled to said voltage-to-current converter and operable for comparing said monitoring current to a threshold current and for generating a detection signal according to a result of said comparison, said detection signal indicating a comparison result between said input voltage and said voltage threshold,
wherein said detection circuit controls said monitoring current and said threshold current according to said detection signal.

15. The electronic system as claimed in claim 14, wherein said voltage-to-current converter changes said voltage threshold by adjusting said bandgap voltage according to said detection signal, and wherein said monitoring current is adjusted if said bandgap voltage is adjusted.

16. The electronic system as claimed in claim 15, wherein said bandgap voltage has a level selected from at least a first level and a second level, and wherein said bandgap voltage has said first level if said input voltage is greater than said voltage threshold, and wherein said bandgap voltage has said second level if said input voltage is less than said voltage threshold.

17. The electronic system as claimed in claim 14, wherein said detection circuit changes said voltage threshold by adjusting said threshold current according to said condition of said input voltage.

18. The electronic system as claimed in claim 17, wherein said threshold current has a level selected from at least a first level and a second level, and wherein said threshold current has said first level if said input voltage is greater than said voltage threshold, and wherein said threshold current has said second level if said input voltage is less than said voltage threshold.

* * * * *